United States Patent [19]
Hanamura

[11] Patent Number: 5,898,563
[45] Date of Patent: Apr. 27, 1999

[54] CHIP COMPOSITE ELECTRONIC COMPONENT WITH IMPROVED MOISTURE RESISTANCE AND METHOD OF MANUFACTURING THE SAME

[75] Inventor: Toshihiro Hanamura, Kyoto, Japan

[73] Assignee: Rohm Co. Ltd., Kyoto, Japan

[21] Appl. No.: 08/864,969

[22] Filed: May 29, 1997

[30] Foreign Application Priority Data

May 31, 1996 [JP] Japan .................................. 8-138134

[51] Int. Cl.⁶ .............................. H01G 4/06; H05K 1/16
[52] U.S. Cl. .......................... 361/313; 361/766; 338/195; 338/308
[58] Field of Search .................................... 361/303–305, 361/306.1, 306.2, 306.3, 308.1, 310–313, 321.1, 321.2, 321.3, 321.4, 321.5, 766, 765; 338/195, 308, 256

[56] References Cited

PUBLICATIONS

U.S.. application No. 08/719,417, Massonori Taniumra, filed Sep. 9, 1996.

*Primary Examiner*—Kristine Kincaid
*Assistant Examiner*—Anthony Dinkins
*Attorney, Agent, or Firm*—Nikaido Marmelstein Murray & Oram LLP

[57] ABSTRACT

Disclosed are a structure and a method of manufacture of a chip composite electronic component with improved moisture resistance. A pair of end electrodes are formed on a surface of the substrate at opposite end portions thereof. An intermediate electrode is formed at a location between the end electrodes on the surface of the substrate. The intermediate electrode includes a lower electrode, a resistor electrode and a pad electrode formed continuous therebetween. Another element is formed on the lower electrode so as to be electrically connected between the lower electrode and one of the end electrodes. A resistance element is formed between the other of the end electrodes and the resistor electrode. A glass layer is formed to cover another element, the resistance element and the pad electrode. A protective layer of a synthetic resin is formed to cover the entire surface of the glass layer and part of each the end electrode.

7 Claims, 8 Drawing Sheets

CHIP COMPOSITE ELECTRONIC COMPONENT WITH IMPROVED MOISTURE RESISTANCE AND METHOD OF MANUFACTURING THE SAME

BACKGROUND OF THE INVENTION

This invention relates to a chip composite electronic component having a capacitor and a resistor of the thick-film type formed on a chip insulator substrate, and a method of manufacturing the same.

The composite component of this type, as shown in FIGS. 11 and 12, is structured by a capacitor 8' and a resistor 10' formed on a ceramic insulator substrate 1'. That is, on the surface of the substrate 1'. opposite end electrodes 2', 3' are provided for external electrical connection. Between these end electrodes 2', 3' is provided continuous connection of a capacitor lower electrode 4a' and a resistor electrode 4b'. The capacitor lower electrode 4a' has a dielectric film 5' provided in a manner covering the same electrode 4a'. A capacitor upper electrode 6' is provided overlying the dielectric film 5' such that one end of the same electrode 6' is electrically connected to one end electrode 2', By covering these elements with a first glass layer 7', a thick-film capacitor is provided Meanwhile, a resistance element 9' is provided to bridge between the resistance electrode 4b' and the other end electrode 3', constituting a thick-film resistor 10' The thick-film capacitor 8' and the thick-film resistor 10' are covered at their entirety by a second glass layer 11' and further a synthetic resin protective coating 12'. Furthermore, side electrodes 13', 14' are provided at opposite end faces of the substrate 1'.

The composite component constructed as above is being manufactured by a method as follows.

(i) First, as shown in FIG. 13, on an insulator substrate 1' are formed respective end electrodes 2', 3', a capacitor lower electrode 4a' and a resistor electrode 4b' and a pad electrode 4c' continuous therebetween. Thereafter a dielectric film 5' is formed covering the capacitor lower electrode 4a'.

(ii) As shown in FIG. 14, a capacitor upper electrode 6' and a first glass layer 7' covering the same are formed, and then a resistance element 9' is formed.

(iii) As shown in FIG. 15, a second glass layer 11' is formed so as to cover the first glass layer 7' and the resistance element 9' except for the area of the pad electrode 4c'. Thereafter, a trimming groove 9a' is formed by irradiation of a laser beam to provide a predetermined resistance value to the resistance element 9' while measuring the resistance value by supplying an electric current through the resistance element 9' with electricity-supply probes A, B respectively contacted with the other end electrode 3' and the pad electrode 4c'.

(iv) As shown in FIG. 16, a synthetic-resin protective coating 12' is formed over almost entire top surface of the substrate 1' Then side electrodes 13' 14' are formed at opposite end face-of the substrate 1'.

In the conventional composite component, the second glass layer 11' is formed to cover the first glass layer 7' and the resistance element 9' except for the area of the pad electrode 4c'. In this state, a trimming groove 9a' is formed by a laser beam to trimming-adjust the resistance value of the resistance element 9' to a predetermined value while measuring the resistance with electricity-supply probes A, B respectively contacted with the other end electrode 3' and the pad electrode 4c'. Thereafter the surface of the substrate 1' is coated by the synthetic-resin protective coat 12'.

The conventional structure uses a synthetic resin of protective coat 12' so that there is an advantage that weight reduction is readily available as compared with the glass coating structure, with reduced cost. Furthermore, externally applied impact to the composite component is relieved by the synthetic-resin coating 12'.

On the contrary, the pad electrode 4c' for trimming-adjusting the resistance value is covered solely by the synthetic-resin coating 12'. However, if the synthetic-resin coat 12' deteriorates due to exposure to a high temperature (approximately 350° C.) when the composite component is solder-mounted onto a circuit board, there often encounters a problem that moisture intrudes to the inside of the protective coat 12' to induce short circuit between the pad electrode 4c' and the other end electrode 3'.

SUMMARY OF THE INVENTION

It is an object of the present invention to provide a reliable chip composite electronic component having a resistance element formed with a trimming groove for resistance adjustment and another element such as for a capacitor, which is resistive to moisture entrance to a pad electrode portion for adjusting the resistance value leading to electric short circuit.

It is another object to provide a method of manufacturing such a chip composite electronic component.

In accordance with the present invention, there is provided a chip composite electronic component comprising:

an insulator substrate;

a pair of end electrodes formed on a surface of the substrate at opposite end portions thereof;

an intermediate electrode formed at a location between the end electrodes on the surface of the substrate, the intermediate electrode including a lower electrode, a resistor electrode and a pad electrode formed continuous therebetween;

another element formed on the lower electrode so an to be electrically connected between the lower electrode and one of the end electrodes;

a resistance element formed between the other of the end electrodes and the resistor electrode;

a glass layer formed to cover the other element, the resistance element and the pad electrode; and a protective layer of a synthetic resin formed to cover the entire surface of the glass layer and part of each the end electrode.

With such structure, the pad electrode is covered by the glass layer to have resistance to heat. Accordingly, the pad electrode is sufficiently protected even during a process involving heat application such as soldering, well preventing against entrance of moisture and improving reliability.

Preferably, the other component is a capacitor comprising the lower electrodes a dielectric film formed on the lower electrode and an upper electrode formed on the dielectric film to be connected to the one end electrode, and a further glass film being provided between the capacitor and the glass layer. With such structure, a chip composite electronic component having a thick-film capacitor and a thick-film resistors wherein the capacitor previously covered by the further glass film is not exposed to contaminants during trimming (adjustment for the resistance value) of the resistance element.

More preferably, a trimming groove is formed in the resistance element for adjusting the resistance value of the resistance element such that the trimming groove extends in a direction perpendicular to a direction of connecting between other end electrode and the resistor electrode.

Further preferably, the glass layer is formed from a low-temperature glass material By doing so, the glass layer can be baked at a relatively low temperature of approximately 500° C. without affecting the resistance value of the resistor once adjusted or the capacitance value of a capacitor.

In accordance with the present inventions there is also provided a method of manufacturing a one-chip electronic composite component comprising:

a step of forming a pair of end electrodes on a surface of an insulator substrate at opposite end portions thereof;

a step of forming an intermediate electrode at a location between the end electrodes on the surface of the substrate so that the intermediate electrode includes a lower electrodes a resistor electrode and a pad electrode formed continuous therebetween;

a step of forming an another element so as to be electrically connected between one of the end electrodes and the lower electrodee;

a step of forming a resistance element between the other of the end electrodes and the resistor electrode;

a step of forming a trimming groove in the resistance element to adjust the resistance value of the resistance element while measuring the resistance value with probes respectively contacted with the pad electrode and the other end electrode;

a step of forming a glass layer to cover the other element, the resistance element and the pad electrode; and a step of forming a protective layer of a synthetic resin to cover the entire of the glass layer and part of each the end electrode.

With such method, entrance of moisture to the pad electrode or the vicinity thereof is prevented with simple process without especially increasing process steps.

Preferably, the other element is provided by forming a dielectric film on the lower electrode to have an upper electrode on the dielectric film so that a capacitor is provided, and the capacitor is covered by a further glass film before forming the resistance element.

More preferably the glass layer is formed by applying and baking a low-temperature glass material.

For a fuller understanding of the nature and advantages of the invention, reference should be made to the ensuing detailed description taken in conjunction with the accompanying drawings.

PREFERRED EMBODIMENT OF THE INVENTION

Figure 2:
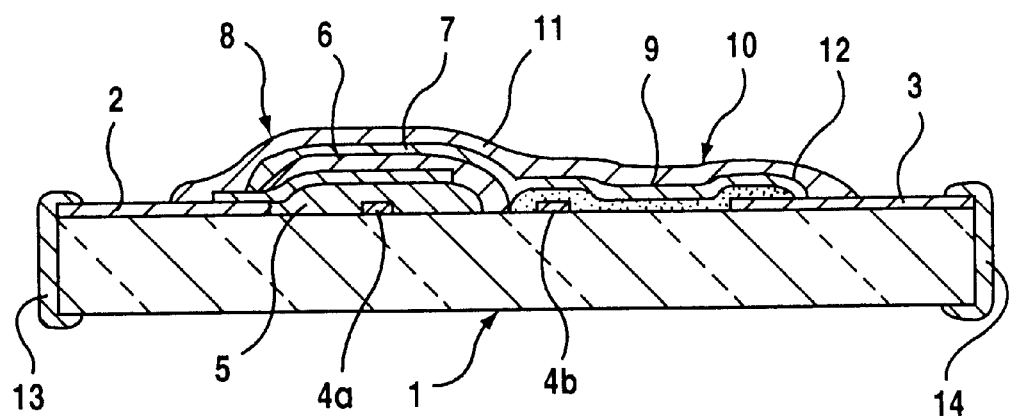
FIG. 2 is a longitudinal sectional view of the chip composite electronic element of FIG. 1.

First referring to FIG. 2, there is illustrated a sectional view of a composite electronic component structure according to one embodiment of the present invention. The composite component has a resistor and a capacitor provided in series between opposite end electrodes 2, 3 formed on both ends of an insulator substrate 1. On the substrate 1, an intermediate electrode is provided at almost an intermediate location between the two end electrodes 2, 3. The intermediate electrode includes by integrally forming a capacitor lower electrode 4a, and a resistor electrode 4b, and a pad electrode 4c.

The capacitor has, besides the lower electrode 4a, a dielectric layer 5 formed over the lower electrode 4a, and an upper electrode 6 formed overlying the dielectric layer 5. The upper electrode 6 is formed continuous with or connected to one end electrode 2. Thus, the capacitor is defined by an area of the dielectric layer 5 sandwiched between the lower electrode 4a and the upper electrodes 6. The capacitor is covered by a first glass film 7 formed by a dielectric glass, etc.

The resistor is formed by a resistance element 9 which is formed for example of ruthenium oxide. The resistance element 9 has one end electrically connected with the other end electrode 3 and the other end electrically connected with the resistor electrode 4b continuous with a lower electrode 4a for the capacitor, providing connection in series between the resistor and the capacitor.

Figure 1:
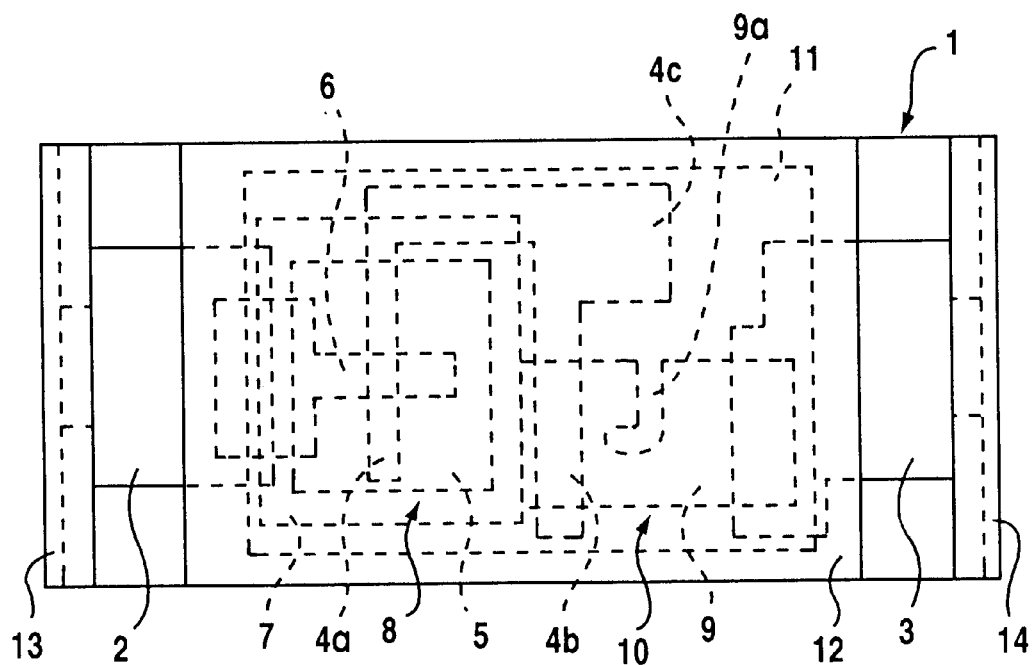
FIG. 1 is a plan view of a chip composite electronic element according to the present invention.

The resistance element 9 has a trimming groove 9a for adjusting a resistance value of the resistance element 9 to an appropriate value. The trimming groove 9a is formed by a laser-trimming technique, stated later. The intermediate electrode thus has the pad electrode 4c (best shown in FIG. 1) extending therefrom The pad electrode 4c serves as an electrode in cooperation with the other end electrode 3 in measuring a resistance value of the resistance element 9 while a trimming groove is being formed by laser-trimming.

The end electrodes 2, 3 respectively extend through side electrodes 13, 14 to. the underside of the substrate 1e for facilitating surface-mounting of the composite component on a mother board, not shown, through e.g. , soldering. These end electrodes 2, 3 each have a surface layer, not shown, formed by an inner Hi electroplating layer and an outer solder layer for enhancing solderability.

Furthers the capacitor 8 and the resistor 10, together with the pad electrode 4c, are commonly covered by a second glass layer 11 The second glass layer 11 helps preventing against entrance of moisture. The second glass layer 11 is formed from a low-temperature glass material, which can be baked at about 500° C. Further, an outermost protection layer 12 is formed of, e.g., an epoxy resin so as to cover almost the entire surface of the substrate 1, except for opposite end areas.

With such structure, the resistance value of the resistance element 9 is to be increased by providing a trimming groove 9a. This is because the electric current flowing through the resistance element 9 is restricted by the presence of the trimming groove 9a. As conventionally known, the trimming groove 9a may be formed by irradiation of a laser beam incident on the resistance element 9, so that part of the resistance element 9 is removed off or trimmed away, thereby increasing the resistance value of the resistance element 9 In laser-trimming, provided that the intensity or energy of the laser beam and the moving rate thereof are constant, the rate of Increase of the resistance is commensurate with the length and the direction of the trimming groove 9a. In case where the trimming groove 9a is in a direction transverse to the lengthwise of the resistance element 9, the resulting resistance value for the resistance element 9 significantly increases, whereas when it is in the direction parallel to the resistance element 9, the increase of the resistance value is comparatively small In practice, the trimming groove is formed in a rectangular form, ie., firstly formed from one side of the resistance element 9 toward the inward or transverse thereof for initial or rough adjustment, and then turned to a lengthwise direction for final or finer adjustment.

In the chip composite electronic component of the invention, the pad electrode 4c that is to be utilized during trimming of the resistance element 9 is doubly covered by the second glass layer 11 and the synthetic resin protection coating 12. With such a structure, even if the synthetic resin coating 12 deteriorates due to heat applied during solder-mounting the composite component onto a circuit boards the presence of the second glass layer 11 prevents moisture from intruding to the pad electrode 4c or the adjacent area thereto In formation of the second glass layer 11 if a pasty glass material of a low-temperature type is employed, it is possible to bake an applied pasty glass material at a relatively low temperature to be formed into a second glass layer 12. By doing so, the formation of the second glass layer 11 does not affect and vary the resistance value of the resistance element once trimming-adjusted as well . as the capacitance value of the capacitor.

A method of manufacturing a chip composite electronic component is then explained hereinbelow.

Figure 3:
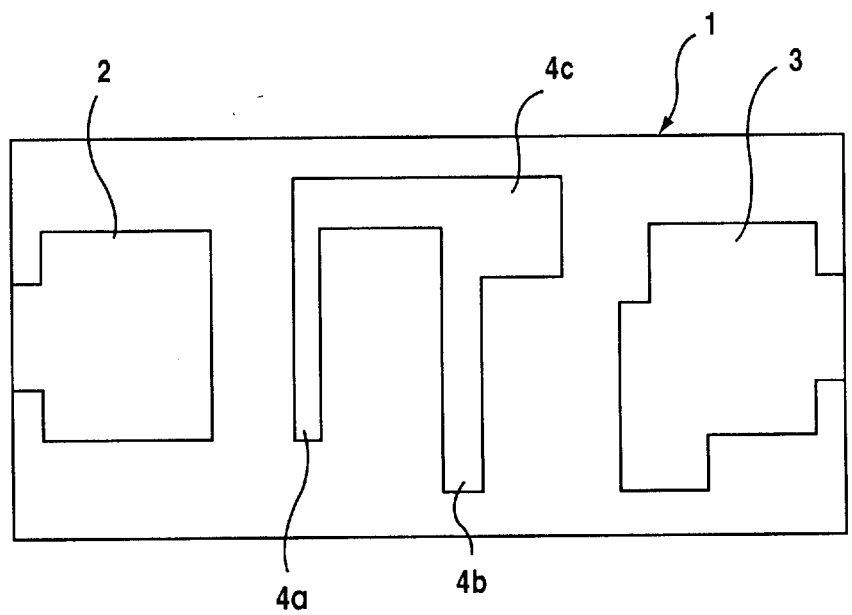
FIG. 3 is a plan view showing opposite end electrodes and an intermediate electrode formed on a surface of an insulator substrate.

Referring to FIG. 3, an divisible large-sized substrate of alumina ceramics is first prepared, in order to manufacture at one time a multiplicity of discrete composite components. The substrate has a number of slits formed in a lattice form so that it is readily broken along the slits into individual parts or unit areas, as stated later. It is noted in FIG. 3 that only one unit area is shown for simplifying explanation.

(i) The substrate is first printed with a pasty material containing silver and palladium in given areas of the upper and lower surfaces thereof. The printed substrate is burnt to form electrodes such as opposite end electrodes 2, 3, as well as an intermediate electrode including a capacitor lower electrode 4a, a resistor electrode 4b and a pad electrode 4c.

Figure 4:
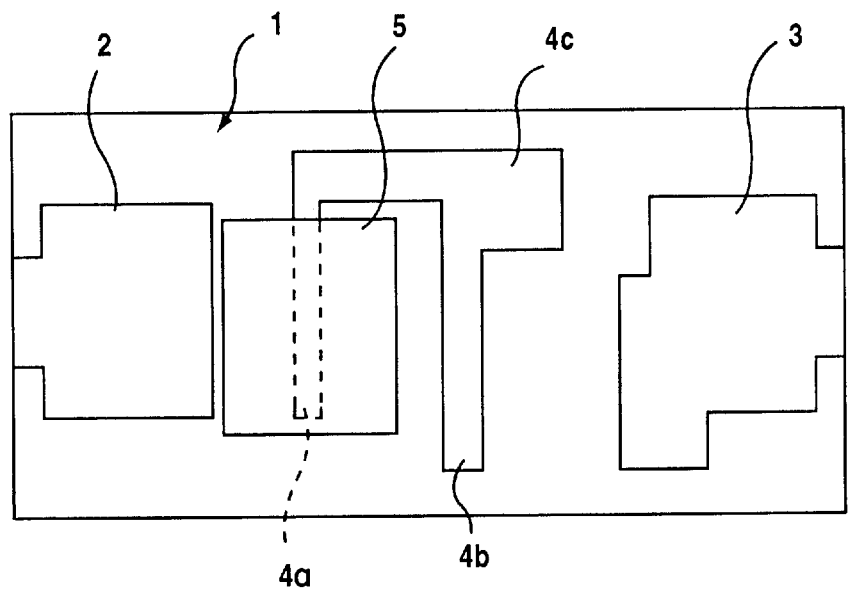
FIG. 4 Hi(sa plan view showing a dielectric film formed on a capacitor lower electrode of the intermediate electrode on the substrate of FIG. 3.

(ii) After, forming these, electrodes, a pasty material containing barium titanate is printed on the surface of the lower electrode 4a. Then, the substrate thus printed is burnt to form a capacitor dielectric layer 5 overlying the lower electrode 4a, as shown in FIG. 4.

Figure 5:
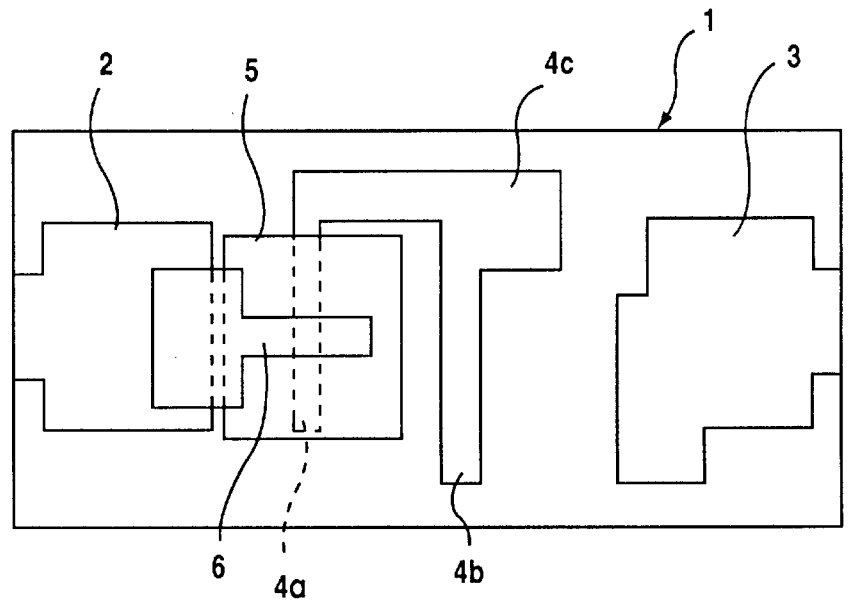
FIG. 5 Is a plan view showing a capacitor upper electrode formed on the dielectric film on the substrate of FIG. 4.

(iii) Thereafter, a silver-and-palladium contained pasty material is printed on the dielectric layer 5 in a manner of bridging to the end electrode 2, and burnt to form an upper electrode 6 for a capacitor, as shown in FIG. 5. Thus, a capacitor is provided by the lower and upper electrodes 4a, 6 and the dielectric layer 5 sandwiched therebetween.

Figure 6:
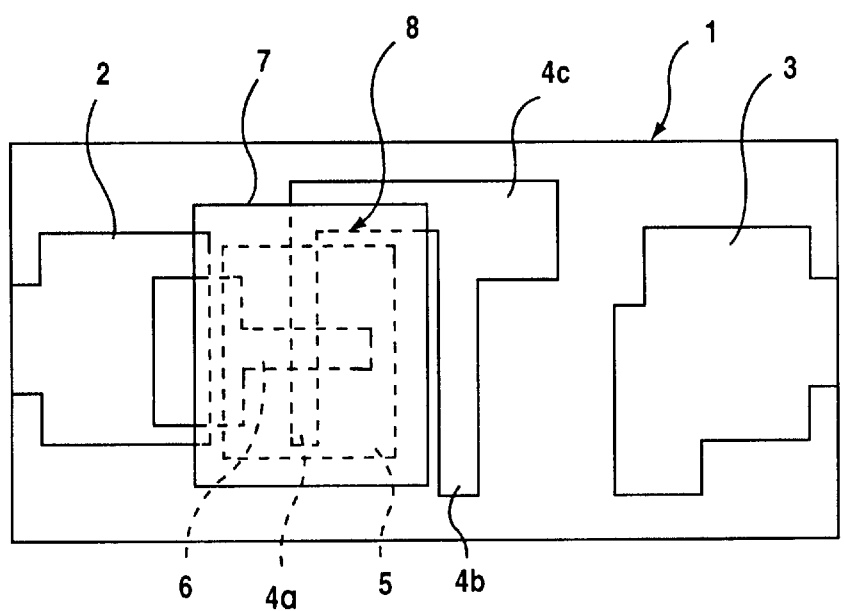
FIG. 6 is a plan view showing a first glass film formed over the capacitor upper electrode on the substrate of FIG. 5.

(iv) After formation of the capacitor, a first glass film 7 is formed by printing and burning to cover the capacitor, as shown in FIG. 6. The first glass film 7 is of a two-layered structure formed by an inner dielectric glass film and an outer alumina-silicate glass film, thereby providing a thick-film capacitor 8.

Figure 7:
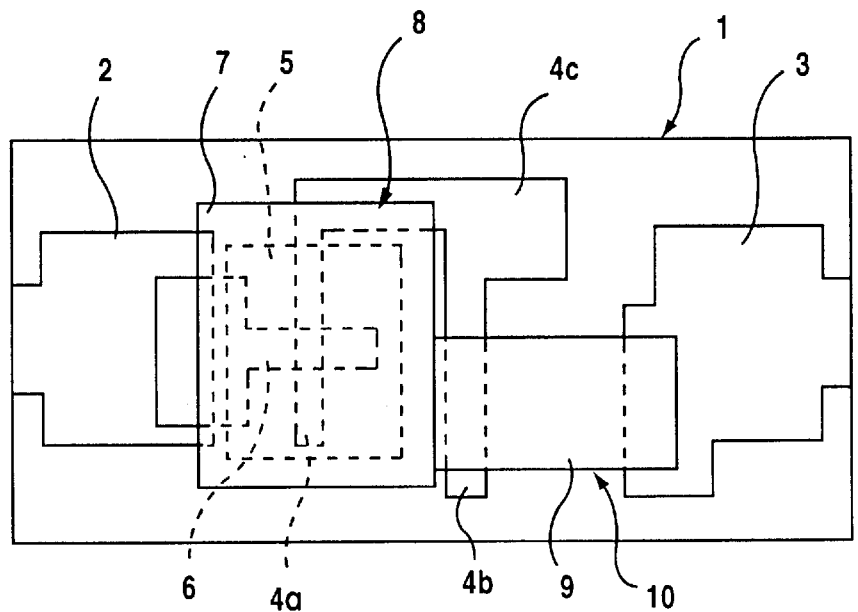
FIG. 7 is a plan view showing a resistance element formed on the insulator substrate of FIG. 6.

(v) Thereafter, a resistance element 9 is formed by printing and burning of a pasty material containing ruthenium oxide, which bridges between the other end electrode 3 and the resistor electrode 4b, thereby providing a thick-film resistor 10 as shown in FIG. 7.

The resistance element 9 may be of a size, e.g., having a length of 0.85 mm by a width of 0.5 mm with a thickness of 10 µm.

Figure 8:
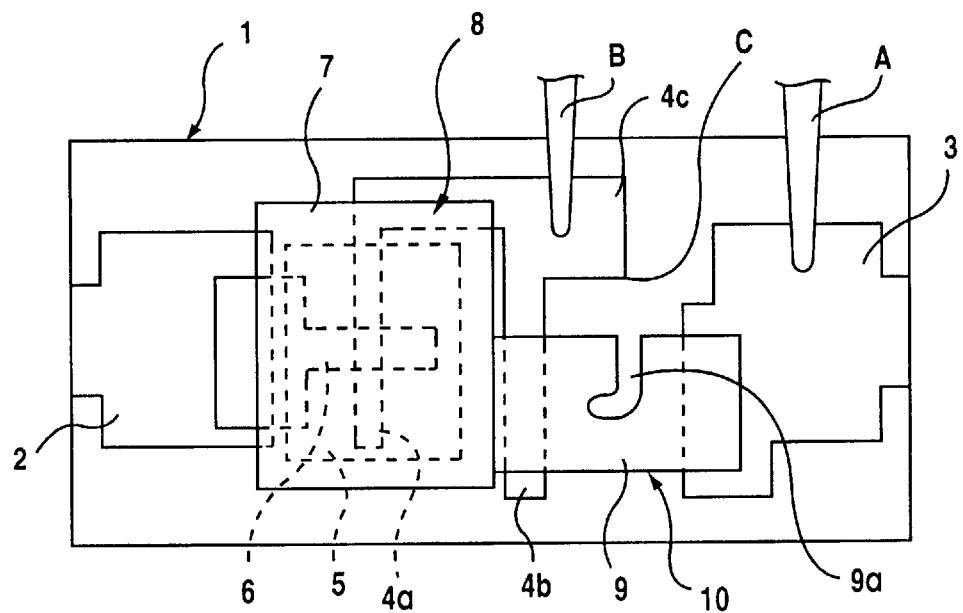
FIG. 8 is a plan view showing a state of performing trimming adjustment on the resistance element on the substrate of FIG. 7.

(vi) Thereafter, the resistance element 9 is subjected to laser-trimming, as shown in FIG. 8. To carry out laser-trimming, the substrate still undivided is placed on a laser-trimmer such that the corner C as a reference position of the pad electrode 4c can be acknowledged by a camera for processing of data information based on an image thereof. Laser-trimming is started from a point close to or spaced by a certain amount from the corner C of the pad electrode 4c. It is noted that the pad electrode 4c is higher in brightness relative to that of the substrate 1 due to difference of optical reflectivity therebetween, providing clear contrast in brightness, when an image is taken by the camera. This facilitates acknowledgment of the corner C and determination of starting point for laser-trimming, thereby enhancing efficiency of laser-trimming particularly for multiplicity of resistance elements 9 provided throughout the undivided substrate.

The laser-trimming is performed by moving the laser beam along a direction traversing the resistance element 9 to a given point from which it is then turned to a lengthwise direction of the resistance element 9, thereby providing a rectangularly formed trimming groove 9a. Such laser-trimming is carried out while measuring the resistance value of the resistance element 9 with using probes A and 3 contacted with the end electrode 3 and the pad electrode 4c. The transverse-direction portion of the trimming groove 9a is for rough adjustment, i.e., for increasing the resistance value up to immediately before reaching a target value, whereas the lengthwise portion is for fine adjustment of achieving the target value. With such laser-trimming, the resistance element is adjusted by increasing its resistance value to a desired target value.

Figure 9:
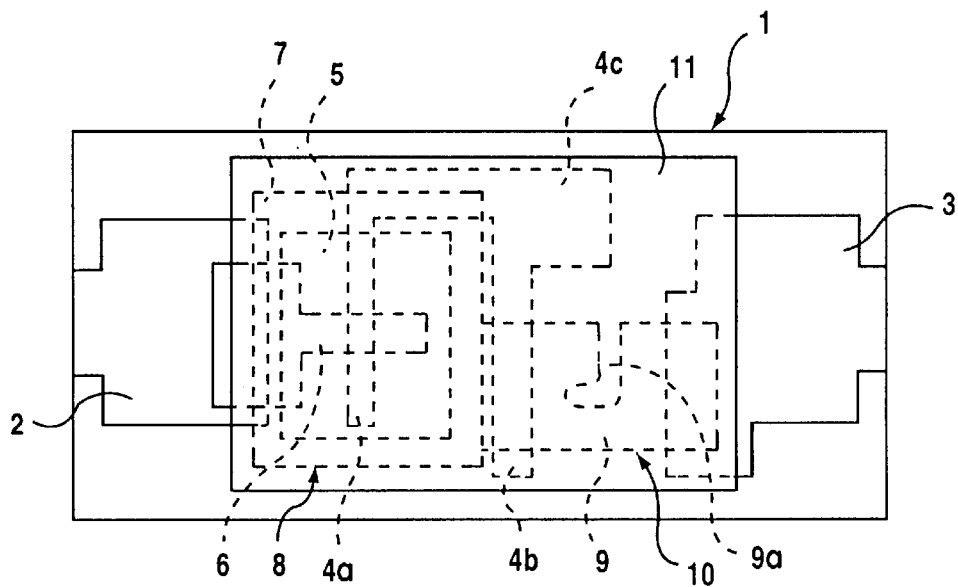
FIG. 9 is a plan view showing a second glass layer formed over the insulator layer on the substrate of FIG. 8.

(vii) Referring to FIG. 9, after carrying out the laser-trimming, a second glass layer 11 is formed of borosilicate-lead glass so as to cover the resistor 10 and the pad electrode 4c together with the capacitor 8 already coated with the first glass film 7 by coating a pasty low-temperature glass material and baking it at about 500° C.

Figure 10:
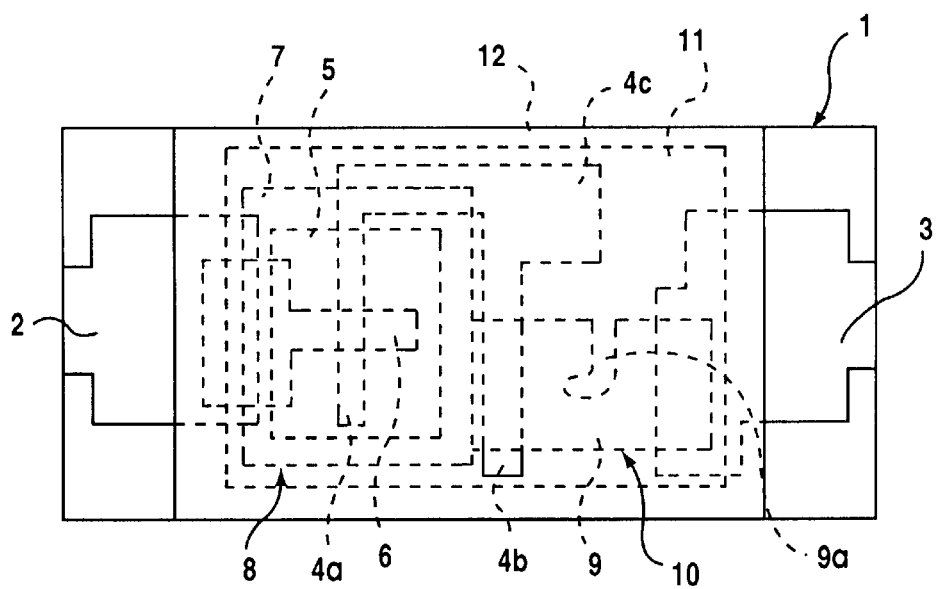
FIG. 10 is a plan view showing a protective coating formed entirely over the insulator substrate of FIG. 9.
Figure 11:
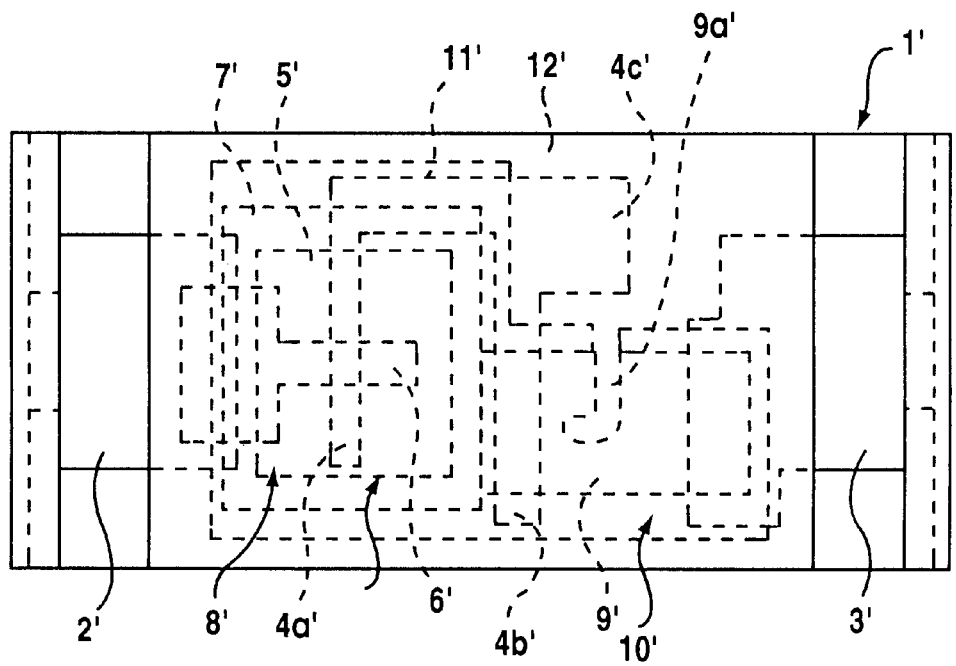
FIG. 11 is a plan view of a conventional chip composite electronic component.
Figure 12:
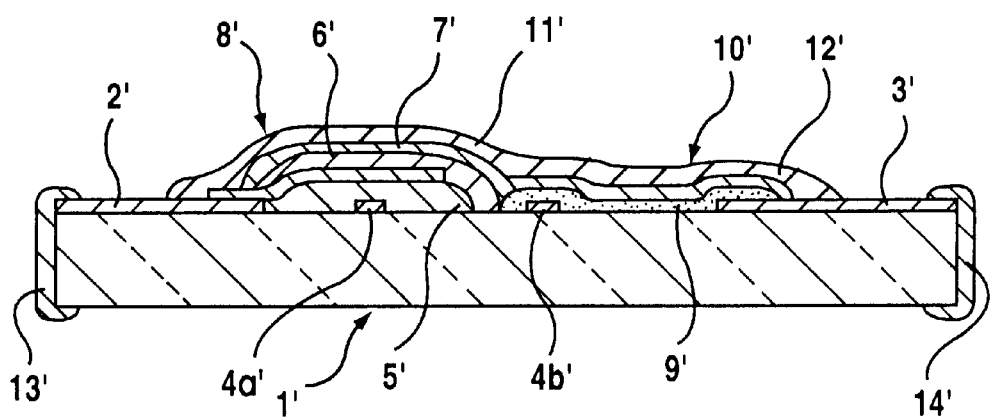
FIG. 12 is a longitudinal sectional view of the conventional chip composite electronic component of FIG.11.
Figure 13:
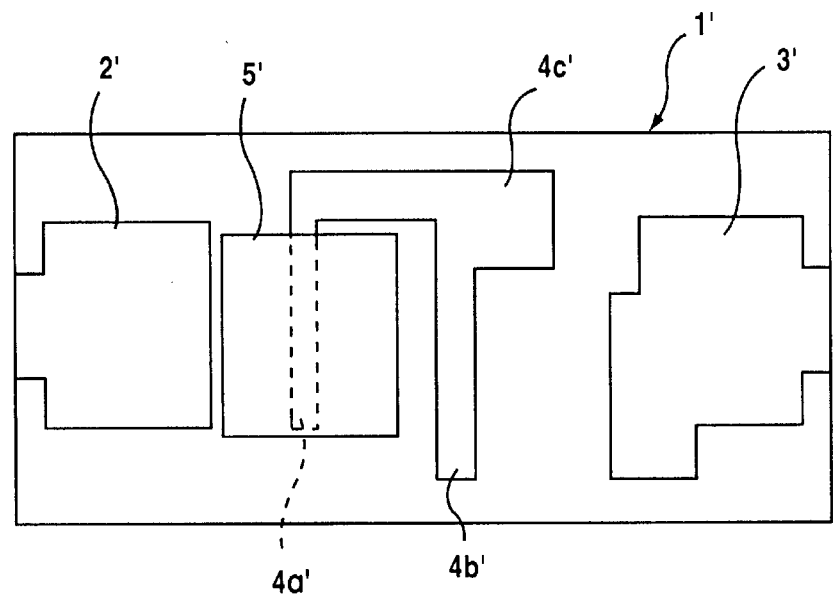
FIG. 13 is a plan view showing opposite end electrodes and an intermediate electrode formed on a surface of an insulator substrate according to the conventional method.
Figure 14:
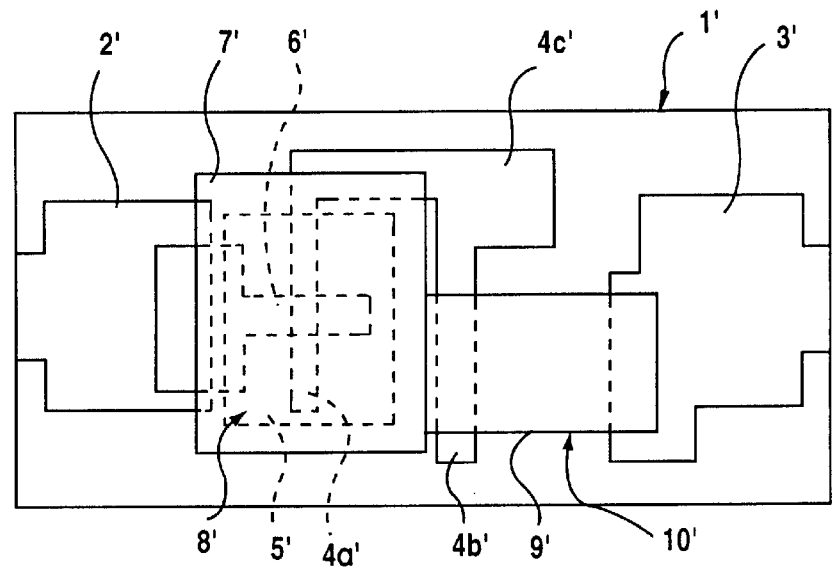
FIG. 14 is a plan view showing a capacitor upper electrode and a first glass film formed on the substrate of FIG. 13.
Figure 15:
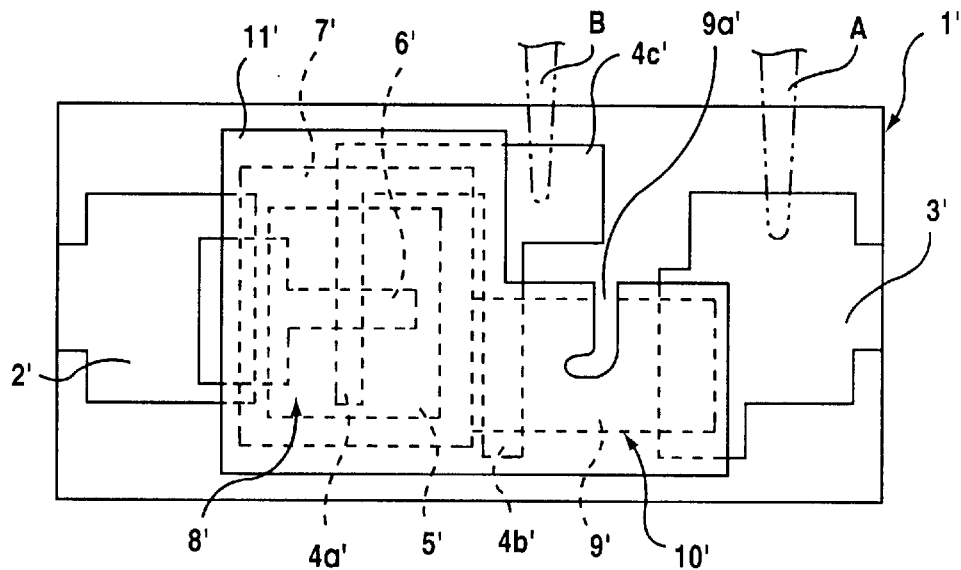
FIG. 15 is a plan view showing a second glass layer formed over the substrate of FIG. 14.
Figure 16:
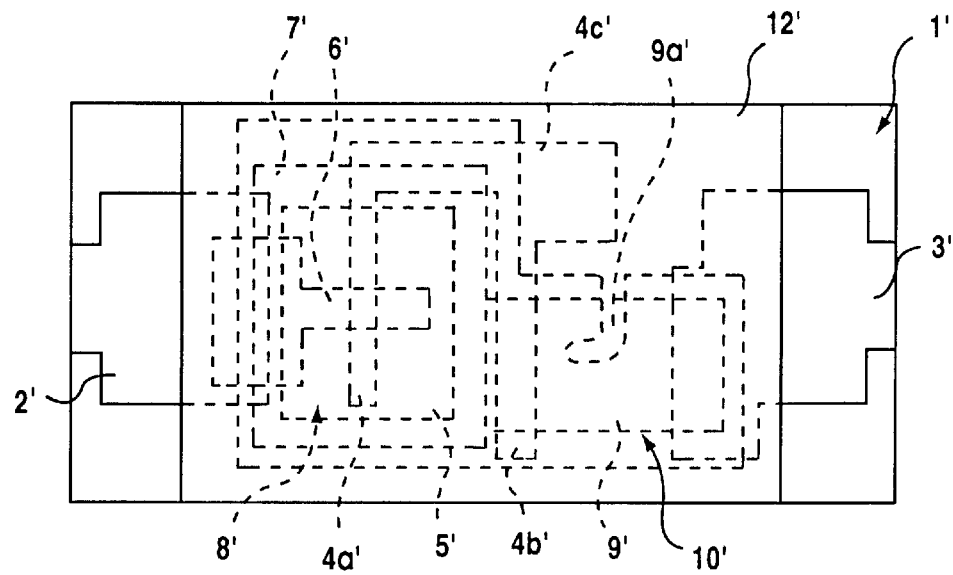
FIG. 16 is a view showing a synthetic-resin protective coat formed over the second glass layer.

(viii) Thereafter, a protection layer 12 is provided to cover over the entire surface of the substrate except for surface areas of the opposite end portions of the substrate 1, as shown in FIG. 10. To form the protection layer 12, an epoxy resin is applied by printing onto the surface of the substrate 1 and then cured.

(ix) Then, the substrate is divided into bar-formed substrates, not shown, by the use of a breaker along each slit extending between the end electrodes 2, 3. Each bar-form substrate is applied at its opposite side faces with an electrically-conductive resin so as to bridge between associated end electrodes 2, 3 on the upper and lower surfaces, providing lateral portions 13, 14 for respective end electrodes 2, 3 (See FIG. 2). By curing the conductive resin, end electrodes each extend through an end face to the underside of the substrate Thereafter, the bar-formed substrate is further divided into a plurality of chip substrate. The divided substrates are subjected to electroplating to form an electroplating layer over each end electrode. The electroplating layer is preferably provided by an inner Ni layer and an outer solder layer. Thus, e provided are chip composite electronic components according to the present invention.

According to the method of the invention, trimming adjustment for the resistance element is not after the formation of the second glass layer. That is, before forming a second glass layer, trimming adjustment for the resistance element is performed by contacting current-supplying probes respectively with the pad electrode and the other end electrode, e and then a second glass layer is formed to cover the pad electrode and the first glass film. A synthetic- resin protection coating is finally formed to cover wholly the surface of the substrate. Therefore, the pad electrode is doubly covered by the second glass layer and the protection coating With such structure, even if the synthetic resin coating deteriorate due to heat during solder-mounting the composite component onto a circuit board, the second glass layer effectively prevents against entrance of moisture to the pad electrode or the adjacent points.

Therefore, a chip composite electronic element comprising thick-film capacitor and resistor is provided with inexpensive manufacture cost, that is prevented against occurrence of short circuit in a resistance element. In particular, by using a low-temperature glass paste for the. second glass layers the paste can be baked at a relatively low temperature without affecting the resistance value of the resistance element after once trimming-adjusted as well as the capacitance value of the capacitor.

In the above embodiments the composite component was constituted by the resistor and the capacitor, but the present invention is not limited to such a structure. It may alternatively be formed by a combination with one or more other electronic elements, e.g., a resistor and an inductance element.

Although preferred embodiments have been described in some detail, it is to be understood that certain changes can be made by those skilled in the art without departing from the spirit and scope of the invention as defined by the appended claims.

What is claimed is:

1. A chip composite electronic component comprising:
   an insulator substrate;
   a pair of end electrodes formed on a surface of said substrate at opposite end portions thereof;
   an intermediate electrode formed at a location between said end electrodes on the surface of said substrate, said intermediate electrode including a lower electrode, a resistor electrode and a pad electrode formed continuous therebetween;
   another element formed on said lower electrode so as to be electrically connected between said lower electrode and one of said end electrodes;
   a resistance element formed between the other of said end electrodes and said resistor electrode;
   a glass layer formed to cover said another element, said resistance element and said pad electrode; and
   a protective layer of a synthetic resin formed to cover the entire surface of said glass layer and part of each said end electrode.

2. The chip composite electronic component of claim 1, wherein said another element is a capacitor comprising said lower electrode, a dielectric film formed on said lower electrode and an upper electrode formed on said dielectric film to be connected to said one end electrode, and a further glass film being provided between said capacitor and said glass layer.

3. The chip composite electronic component of claim 1, wherein a trimming groove is formed in said resistance element for adjusting a resistance value of said resistance element such that said trimming groove extends in a direction perpendicular to a direction connecting between said other end electrode and said resistor electrode.

4. The chip composite electronic component of claim 1, wherein said glass layer is formed from a low-temperature glass material.

5. A method of manufacturing a chip composite electronic component comprising:
   a step of forming a pair, of end electrodes on a surface of an insulator substrate at opposite end portions thereof;
   a step of forming an intermediate electrode at a location between said end electrodes on the surface of said substrate so that said intermediate electrode includes a lower electrode, a resistor electrode and a pad electrode formed continuous therebetween;
   a step of forming an another element so as to be electrically connected between one of said end electrodes and said lower electrode;
   a step of forming a resistance element between the other of said end electrodes and said resistor electrode;
   a step of forming a trimming groove in said resistance element to adjust a resistance value of said resistance element while measuring the resistance value with probes respectively contacted with said pad electrode and said other end electrode;
   a step of forming a glass layer to cover said another element, said resistance element and said pad electrode; and
   a step of forming a protective layer of a synthetic resin to cover the entire surface of said glass layer and part of each said end electrode.

6. The method of manufacturing a chip composite electronic component of claim 5, wherein said another element is provided by forming a dielectric film on said lower electrode to have an upper electrode on said dielectric film so that a capacitor is provided, and said capacitor is covered by a further glass layer before forming said resistance element.

7. The method of manufacturing a chip composite electronic component of claim 5, wherein said glass layer is formed by applying and baking a low-temperature glass material.

* * * * *